United States Patent
Itahashi (10) Patent No.: US 8,803,062 B2
(45) Date of Patent: Aug. 12, 2014

(54) PHOTOELECTRIC CONVERSION DEVICE HAVING A LIGHT-SHIELDING FILM

(71) Applicant: Canon Kabushiki Kaisha, Tokyo (JP)

(72) Inventor: Masatsugu Itahashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/839,719

(22) Filed: Mar. 15, 2013

(65) Prior Publication Data
US 2013/0208158 A1 Aug. 15, 2013

Related U.S. Application Data

(63) Continuation of application No. 12/644,336, filed on Dec. 22, 2009, now Pat. No. 8,426,794.

(30) Foreign Application Priority Data

Jan. 13, 2009 (JP) ................................ 2009-005135

(51) Int. Cl.
*G01J 1/42* (2006.01)
*H01L 27/146* (2006.01)
*H01L 27/148* (2006.01)

(52) U.S. Cl.
CPC .... *H01L 27/14623* (2013.01); *H01L 27/14818* (2013.01)
USPC ........................ 250/208.2; 250/214.1; 257/435

(58) Field of Classification Search
CPC .................. H01L 27/14623; H01L 27/14818; H01L 27/14625; H01L 27/3272; H01L 29/78633
USPC ..................... 250/208.1, 214.1, 214 R, 208.2; 348/272, 281, 282, 283, 294, 302, 303, 348/304, 307, 308, 311; 257/431, 444, 461, 257/458
See application file for complete search history.

(56) References Cited

U.S. PATENT DOCUMENTS

| | | | |
|---|---|---|---|
| 6,618,087 B1 | 9/2003 | Hokari et al. | 348/311 |
| 2006/0192883 A1* | 8/2006 | Katsuno et al. | 348/340 |

(Continued)

FOREIGN PATENT DOCUMENTS

| | | |
|---|---|---|
| CN | 1219776 A | 6/1999 |
| JP | 2004-140152 A | 5/2004 |

(Continued)

OTHER PUBLICATIONS

State Intellectual Property Office of the People's Republic of China, Office Action in connection with Application No. 201010001545.6, dated May 31, 2012 (6 pages).

(Continued)

*Primary Examiner* — Francis M Legasse, Jr.
(74) *Attorney, Agent, or Firm* — Fitzpatrick, Cella, Harper & Scinto (57) ABSTRACT

A photoelectric conversion device includes a photoelectric conversion unit which is arranged in a semiconductor substrate, a charge holding portion which is arranged in the semiconductor substrate and temporarily holds a charge generated by the photoelectric conversion unit, a first transfer electrode which is arranged at a position above the semiconductor substrate to transfer a charge generated by the photoelectric conversion unit to the charge holding portion, a charge-voltage converter which is arranged in the semiconductor substrate and converts a charge into a voltage, and a second transfer electrode which is arranged at a position above the semiconductor substrate to transfer a charge held by the charge holding portion to the charge-voltage converter, and the first transfer electrode is arranged to cover the charge holding portion, and not to overlap the second transfer electrode when viewed from a direction perpendicular to the upper surface of the semiconductor substrate.

15 Claims, 9 Drawing Sheets

(56) References Cited

U.S. PATENT DOCUMENTS

| | | | |
|---|---|---|---|
| 2006/0278896 A1 | 12/2006 | Inoue | 257/215 |
| 2008/0029793 A1 | 2/2008 | Watanabe et al. | 257/291 |
| 2008/0036888 A1* | 2/2008 | Sugawa et al. | 348/294 |
| 2009/0136174 A1 | 5/2009 | Itahashi | 385/14 |

FOREIGN PATENT DOCUMENTS

| | | |
|---|---|---|
| JP | 2006-261532 A | 9/2006 |
| JP | 2006-344916 A | 12/2006 |
| JP | 2007-115803 A | 5/2007 |
| JP | 2007-157912 A | 6/2007 |
| JP | 2008-004692 A | 1/2008 |
| JP | 2008-112795 A | 5/2008 |

OTHER PUBLICATIONS

Chinese Official Action in Chinese Patent Appln. No. 201010001545.6 dated Jun. 24, 2011.

* cited by examiner

PHOTOELECTRIC CONVERSION DEVICE HAVING A LIGHT-SHIELDING FILM

CROSS REFERENCE TO RELATED APPLICATION

This application is a continuation of U.S. application Ser. No. 12/644,336 filed on Dec. 22, 2009, the entire disclosure of which is hereby incorporated by reference herein.

BACKGROUND OF THE INVENTION

1. Field of the Invention

The present invention relates to a photoelectric conversion device, image capturing system, and method of manufacturing a photoelectric conversion device.

2. Description of the Related Art

An active-pixel type photoelectric conversion device represented by a CMOS image sensor includes a pixel array in which a plurality of pixels are arranged in a matrix pattern, and an output circuit which processes a signal read out from the pixel array onto a signal line and outputs the processed signal. Some photoelectric conversion devices of this type have a global electronic shutter function in which all pixels in the pixel array start and end charge accumulation operations at the same timings.

Note that the CMOS image sensor cannot read out signals of pixels of all rows in the pixel array onto signal lines at the same time in terms of its structure. In a photoelectric conversion device having the global electronic shutter function, each pixel immediately transfers a charge accumulated by a photodiode (PD) to a carrier pocket (CP) in place of a floating diffusion (FD) at the end timing of the charge accumulation operation. A charge which is transferred to and held by the CP in each of pixels of each row is sequentially transferred from the CP to the FD for each row, and a signal according to the charge transferred to the FD is read out onto a signal line by an amplification transistor of each pixel.

Note that the CP has a role of holding a charge after completion of accumulation of a certain pixel until the charge is read out. Therefore, when light becomes incident on the CP and a charge is generated by photoelectric conversion at a PN junction which contacts the CP, leak noise of light is mixed in a signal held in the CP. As a result, the image quality of an obtained image deteriorates.

In order to solve the above problem, in Japanese Patent Laid-Open No. 2007-115803, the CP is covered by a first transfer gate electrode used to transfer a charge from the PD to the CP, and the first transfer gate electrode is covered by a second transfer gate electrode used to transfer a charge from the CP to the FD. Thus, according to Japanese Patent Laid-Open No. 2007-115803, intrusion of light into the CP can be suppressed.

With the technique described in Japanese Patent Laid-Open No. 2007-115803, a pattern of the first transfer gate electrode is formed above a semiconductor substrate, an insulation film is formed to cover the first transfer gate electrode, and a pattern of the second transfer gate electrode is then formed on that insulation film. With this manufacturing method, processes required to form the first and second transfer gate electrodes are complicated.

SUMMARY OF THE INVENTION

The present invention provides a photoelectric conversion device, which is advantageous to simplify a process for forming a structure required to optically shield a charge holding portion used to temporarily hold a charge generated by a photoelectric conversion unit.

The first aspect of the present invention provides a photoelectric conversion device comprising a photoelectric conversion unit which is arranged in a semiconductor substrate, a charge holding portion which is arranged in the semiconductor substrate and temporarily holds a charge generated by the photoelectric conversion unit, a first transfer electrode which is arranged at a position above the semiconductor substrate to transfer a charge generated by the photoelectric conversion unit to the charge holding portion, a charge-voltage converter which is arranged in the semiconductor substrate and converts a charge into a voltage, and a second transfer electrode which is arranged at a position above the semiconductor substrate to transfer a charge held by the charge holding portion to the charge-voltage converter, wherein the first transfer electrode is arranged to cover the charge holding portion so as to optically shield the charge holding portion, and not to overlap the second transfer electrode.

The second aspect of the present invention provides an image capturing system comprising a photoelectric conversion device according to the first aspect of the present invention, an optical system which forms an image on an imaging surface of the photoelectric conversion device, and a signal processing unit which generates image data by processing a signal output from the photoelectric conversion device.

The third aspect of the present invention provides a method of manufacturing a photoelectric conversion device having a semiconductor substrate in which a photoelectric conversion unit, a charge holding portion which temporarily holds a charge generated by the photoelectric conversion unit, and a charge-voltage converter which converts a charge into a voltage are arranged, the method comprising the first step of simultaneously executing formation of a first polysilicon layer on the semiconductor substrate, of a first transfer electrode used to transfer a charge generated by the photoelectric conversion unit to the charge holding portion, and formation of a second polysilicon layer on the semiconductor substrate, of a second transfer electrode used to transfer a charge of the charge holding portion to the charge-voltage converter, the second step of forming an insulation film to cover the first polysilicon layer and the second polysilicon layer, the third step of etching the insulation film to expose an upper surface of the first polysilicon layer and an upper surface of the second polysilicon layer, the fourth step of forming a metal layer to cover the first polysilicon layer, the second polysilicon layer, and the etched insulation film, and the fifth step of performing annealing to respectively convert an upper portion of the first polysilicon layer and an upper portion of the second polysilicon layer into a first metal silicide layer and a second metal silicide layer, so as to simultaneously form the first transfer electrode including a lower portion of the first polysilicon layer and the first metal silicide layer, and the second transfer electrode including a lower portion of the second polysilicon layer and the second metal silicide layer, wherein in the first step, the first polysilicon layer is formed to cover the charge holding portion and not to overlap the second polysilicon layer, and in the fifth step, the first transfer electrode is formed to cover the charge holding portion so as to optically shield the charge holding portion, and not to overlap the second transfer electrode.

According to the present invention, a photoelectric conversion device, which is advantageous to simplify a process for forming a structure required to optically shield a charge holding portion used to temporarily hold a charge generated by a photoelectric conversion unit, can be provided.

Further features of the present invention will become apparent from the following description of exemplary embodiments with reference to the attached drawings.

DESCRIPTION OF THE EMBODIMENTS

Figure 1:
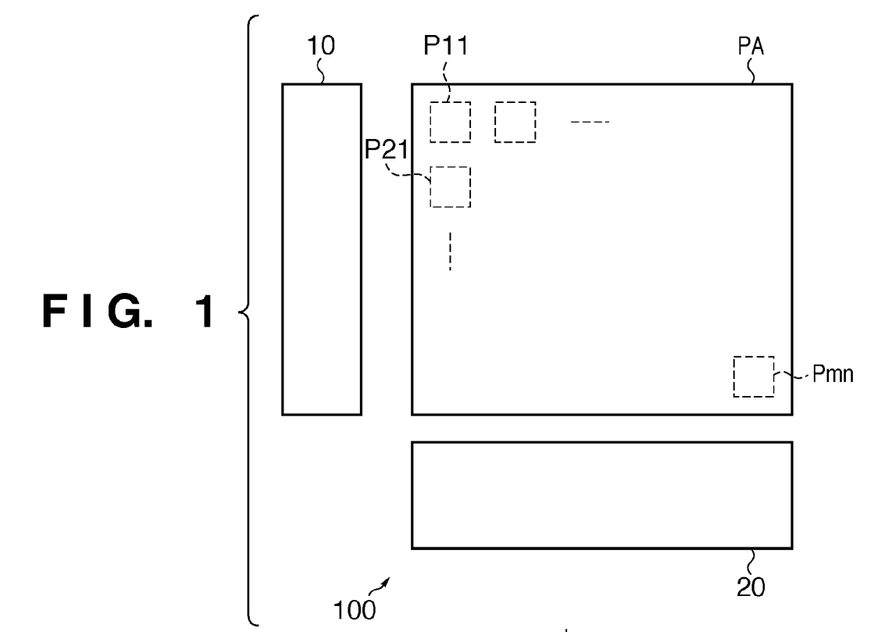
FIG. 1 is a schematic view showing the structure of a photoelectric conversion device 100 according to the first embodiment of the present invention.
Figure 2:
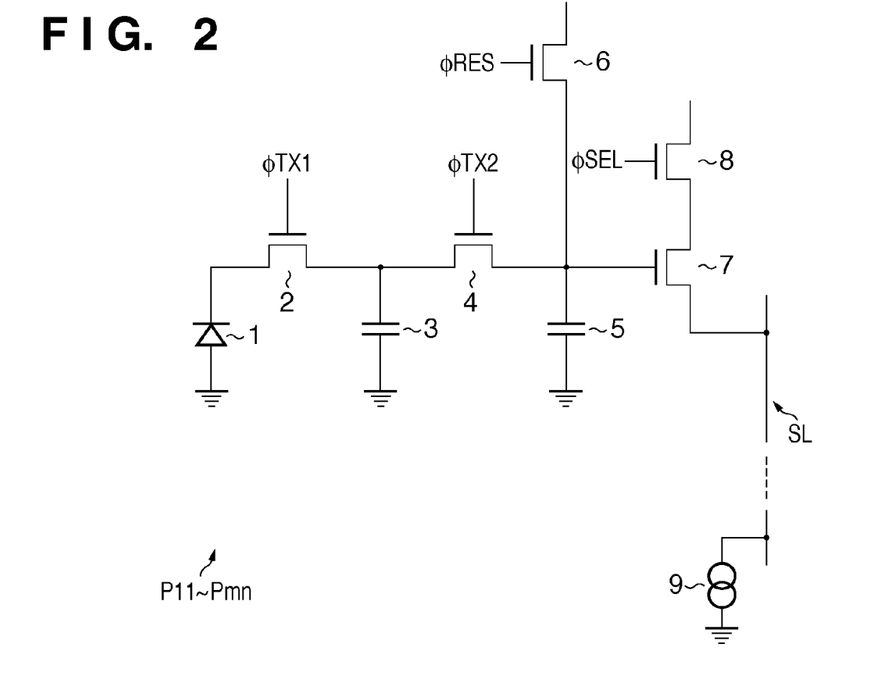
FIG. 2 is a circuit diagram showing the arrangement of a pixel according to the first embodiment of the present invention.

A schematic structure of a photoelectric conversion device 100 according to the first embodiment of the present invention will be described below with reference to FIGS. 1 and 2. FIG. 1 is a schematic view showing the structure of the photoelectric conversion device 100 according to the first embodiment of the present invention. FIG. 2 is a circuit diagram showing the arrangement of a pixel according to the first embodiment of the present invention.

The photoelectric conversion device 100 includes a pixel array PA, vertical scanning circuit 10, and output circuit 20.

In the pixel array PA, a plurality of pixels P11 to Pmn are two-dimensionally laid out. Each of the pixels P11 to Pmn includes a photoelectric conversion unit 1, first transfer unit 2, charge holding portion 3, second transfer unit 4, charge-voltage converter 5, reset unit 6, output unit 7, and selection unit 8, as shown in FIG. 2.

The photoelectric conversion unit 1 executes a charge accumulation operation for generating and accumulating a charge according to light after a first reset operation (to be described later) is completed. The photoelectric conversion unit 1 is, for example, a photodiode.

The first transfer unit 2 transfers a charge of the photoelectric conversion unit 1 to the charge holding portion 3. The first transfer unit 2 is, for example, a transfer transistor, which transfers a charge of the photoelectric conversion unit 1 to the charge holding portion 3 when it is enabled in response to a transfer control signal φTX1 of active level supplied from the vertical scanning circuit 10 to its gate.

The charge holding portion 3 temporarily holds a charge which is generated by the photoelectric conversion unit 1 and is transferred by the first transfer unit 2.

The second transfer unit 4 transfers a charge of the charge holding unit 3 to the charge-voltage converter 5. The second transfer unit 4 is, for example, a transfer transistor, which transfers a charge of the charge holding unit 3 to the charge-voltage converter 5 when it is enabled in response to a transfer control signal φTX2 of active level supplied from the vertical scanning circuit 10 to its gate.

The charge-voltage converter 5 converts a charge transferred by the second transfer unit 4 into a voltage. The charge-voltage converter 5 is, for example, a floating diffusion.

The reset unit 6 executes a first reset operation for resetting the photoelectric conversion unit 1, charge holding portion 3, and charge-voltage converter 5 while both the first and second transfer units 2 and 4 are ON. The reset unit 6 executes a second reset operation for resetting the charge-voltage converter 5 while both the first and second transfer units 2 and 4 are OFF. The reset unit 6 is, for example, a reset transistor, which executes the aforementioned first or second reset operation when it is enabled in response to a reset control signal φRES of active level supplied from the vertical scanning circuit 10 to its gate.

The output unit 7 outputs a signal corresponding to the voltage of the charge-voltage converter 5 onto a signal line SL. The output unit 7 is, for example, an amplification transistor, which executes a source-follower operation together with a current source load 9 connected to the signal line SL, thereby outputting a signal corresponding to the voltage of the charge-voltage converter 5 onto the signal line SL. That is, the output unit 7 outputs a noise signal corresponding to the voltage of the charge-voltage converter 5 onto the signal line SL in a state in which the charge-voltage converter 5 is reset by the reset unit 6 (i.e., the second reset operation is complete). The output unit 7 outputs a light signal corresponding to the voltage of the charge-voltage converter 5 onto the signal line SL in a state in which a charge of the charge holding unit 3 is transferred by the second transfer unit 4 to the charge-voltage converter 5.

The selection unit 8 sets the pixel in a selection/non-selection state. The selection unit 8 is, for example, a selection transistor, which sets the pixel in a selection state when it is enabled in response to a selection control signal φSEL of active level supplied from the vertical scanning circuit 10 to its gate. The selection unit 8 sets the pixel in a non-selection state when it is disabled in response to the selection control signal φSEL of non-active level supplied from the vertical scanning circuit 10 to its gate.

The vertical scanning circuit 10 drives the pixel array PA to control the respective pixels to execute the charge accumulation operations. More specifically, the vertical scanning circuit 10 simultaneously completes the first reset operations of all the pixels in the pixel array PA, thereby simultaneously starting the charge accumulation operations by the photoelectric conversion units among all the pixels. Also, the vertical scanning circuit 10 simultaneously executes first transfer operations for enabling the first transfer units 2 while the second transfer units 4 are disabled in all the pixels of the pixel array PA, thereby simultaneously completing the charge accumulation operations by the photoelectric conversion units among all the pixels. In this way, a global electronic shutter function is implemented.

The vertical scanning circuit 10 selects a read row from which signals are to be read out in the pixel array PA by scanning the pixel array PA in the vertical direction. The vertical scanning circuit 10 executes second transfer operations for enabling the second transfer units 4 while the first transfer units 2 are disabled in pixels in the selected read row. Then, charges held by the charge holding portions 3 are transferred to the charge-voltage converters 5 and are converted into voltages, and the output units 7 output light signals according to the voltages of the charge-voltage converters 5 onto the signal line SL in the pixels in the read row. The vertical scanning circuit 10 executes and completes the second reset operations at different timings. Thus, in the pixels in the read row, the output units 7 output noise signals according to the voltages of the charge-voltage converters 5 onto the signal line SL. That is, the vertical scanning circuit 10 sequentially executes the second transfer operations and second reset operations in pixels in respective rows of the pixel array PA, thereby controlling to execute read operations of signals from the pixels of the respective rows.

The output circuit 20 processes signals output from the pixels in the read row in the pixel array PA, and outputs the processed signals. More specifically, the output circuit 20 generates and outputs an image signal by calculating the differences between the noise signals and light signals output from the pixels in the read row.

Figure 3:
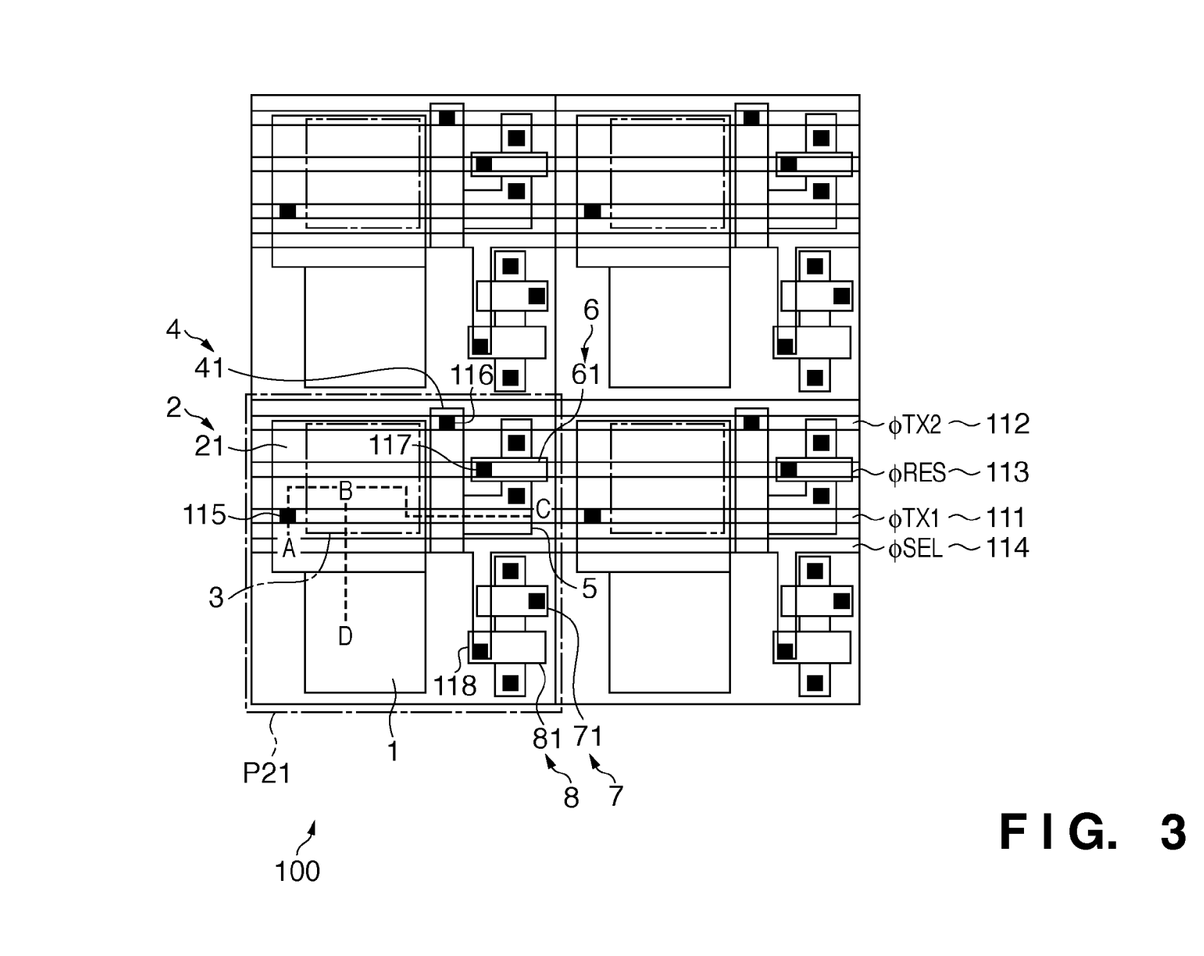
FIG. 3 is a view showing a layout arrangement example of the photoelectric conversion device 100 according to the first embodiment of the present invention.

A layout arrangement example of the photoelectric conversion device 100 according to the first embodiment of the present invention will be described below with reference to FIG. 3. FIG. 3 is a view showing a layout arrangement example for four pixels of the photoelectric conversion device 100 according to the first embodiment of the present invention. The layout arrangement of a pixel P21 (see FIG. 1) bounded by the one-dashed chain line in FIG. 3 will be mainly explained below, but the layout arrangements of other pixels are the same as that of the pixel P21. Note that FIG. 3 corresponds to a view that sees through respective elements from a direction perpendicular to the upper surface of a semiconductor substrate SB (see FIGS. 4A and 4B). In FIG. 3, elements which are not required for a description are not illustrated.

In the pixel P21, a first transfer electrode 21 as the gate of the first transfer unit (transfer transistor) 2 is arranged at an upper neighboring position of the photoelectric conversion unit in FIG. 3. To the first transfer electrode 21, the vertical scanning circuit 10 (see FIG. 1) supplies the first transfer control signal φTX1 via a first transfer control line 111.

The first transfer control line 111 extends in the right-and-left direction in FIG. 3 so as to cross the first transfer electrode 21. The first transfer control line 111 is electrically connected to the first transfer electrode 21 via a contact plug 115 at a position where it crosses the first transfer electrode 21.

The charge holding portion 3 is arranged at a position above the photoelectric conversion unit 1 in FIG. 3 and in a region included in a region where the first transfer electrode 21 is arranged, as indicated by the one-dashed chain line. The first transfer electrode 21 extends to cover the charge holding portion 3 when viewed from the direction perpendicular to the upper surface of the semiconductor substrate SB.

A second transfer electrode 41 as the gate of the second transfer unit (transfer transistor) 4 is arranged at a right neighboring position of the first transfer electrode 21 and charge holding portion 3 in FIG. 3. To the second transfer electrode 41, the vertical scanning circuit 10 (see FIG. 1) supplies the second transfer control signal φTX2 via a second transfer control line 112.

The second transfer control line 112 extends in the right-and-left direction in FIG. 3 to cross the second transfer electrode 41. The second transfer control line 112 is electrically connected to the second transfer electrode 41 via a contact plug 116 at a position where it crosses the second transfer electrode 41.

The charge-voltage converter 5 is arranged at a right neighboring position of the second transfer electrode 41 in FIG. 3. The charge-voltage converter 5 extends in an inverted L-shape.

A gate 61 of the reset unit (reset transistor) 6 is arranged at an upper neighboring position of the charge-voltage converter 5 in FIG. 3. To the gate 61, the vertical scanning circuit 10 (see FIG. 1) supplies the reset control signal φRES via a reset control line 113.

The reset control line 113 extends in the right-and-left direction in FIG. 3 to cross the gate 61. The reset control line 113 is electrically connected to the gate 61 via a contact plug 117 at a position where it crosses the gate 61.

A gate 71 of the output unit (amplification transistor) 7 is arranged at a position below the charge-voltage converter 5 in FIG. 3. The gate 71 is electrically connected to the charge-voltage converter 5 via a line (not shown). The gate 71 receives a voltage from the charge-voltage converter 5.

A gate 81 of the selection unit (selection transistor) 8 is arranged at a position below the gate 71 in FIG. 3. To the gate 81, the vertical scanning circuit 10 (see FIG. 1) supplies the selection control signal φSEL via a selection control line 114.

The selection control line 114 extends in the right-and-left direction in FIG. 3 and extends to cross the gate 81. The selection control line 114 is electrically connected to the gate 81 via a contact plug 118 at a position where it crosses the gate 81.

In this way, by connecting the first and second transfer electrodes 21 and 41 to different lines (first and second transfer control lines 111 and 112) via the electrically isolated contact plugs, their potentials can be independently controlled.

Figure 4A:
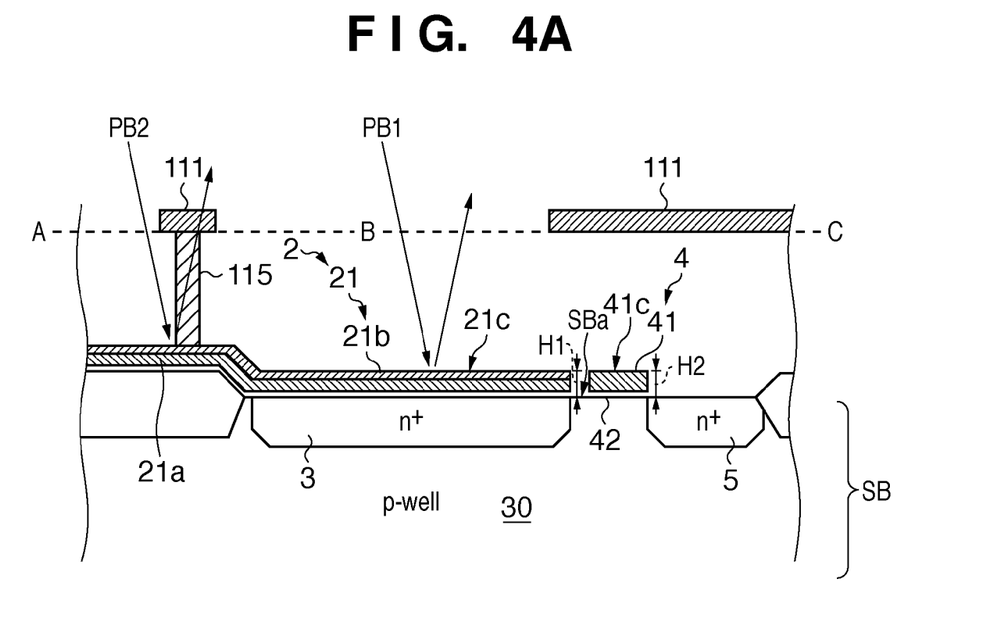
FIGS. 4A and 4B are sectional views showing the sectional structures of the photoelectric conversion device 100 according to the first embodiment of the present invention.
Figure 4B:
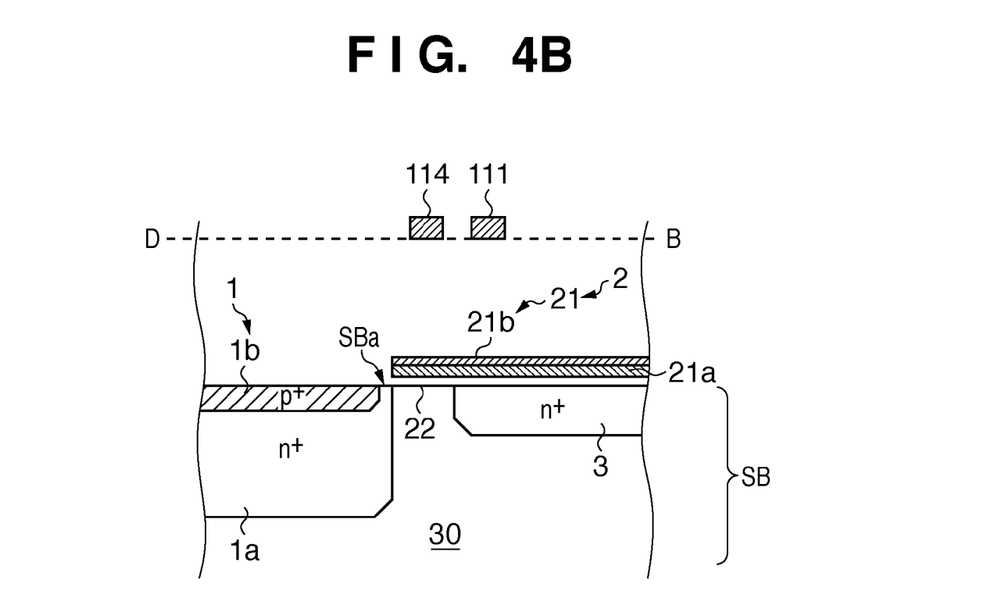

The sectional structure of the photoelectric conversion device 100 according to the first embodiment of the present invention will be described below with reference to FIGS. 4A and 4B. FIGS. 4A and 4B are sectional views showing the sectional structures of the photoelectric conversion device 100 according to the first embodiment of the present invention. FIG. 4A is a sectional view taken along a line A-B-C in FIG. 3, and FIG. 4B is a sectional view taken along a line D-B in FIG. 3. A case will be exemplified below wherein a carrier is an electron, and a charge carried by the carrier is a negative charge. However, the present invention is similarly applicable to a case in which a carrier is a hole, and a charge carried by the carrier is a positive charge, if n- and p-types replace each other.

As shown in FIG. 4B, the photoelectric conversion unit 1 is arranged in a p-type well 30 in the semiconductor substrate SB. The photoelectric conversion unit 1 includes a charge accumulation region 1a used to accumulate a charge, and a protection layer 1b used to protect the charge accumulation region 1a. The charge accumulation region 1a contains a heavily doped n-type impurity. The protection layer 1b contains a heavily doped p-type impurity.

As shown in FIG. 4B, a channel region 22 of the first transfer unit (transfer transistor) 2 is arranged between the charge accumulation region 1a and charge holding portion 3 in the p-type well 30 in the semiconductor substrate SB. The channel region 22 is a semiconductor region containing a p-type impurity. When the first transfer control signal of active level is supplied to the first transfer electrode 21 via the first transfer control line 111 and contact plug 115, a channel which electrically connects the charge accumulation region 1a and charge holding portion 3 is formed in the channel region 22. When the first transfer control signal of non-active level is supplied to the first transfer electrode 21, the channel region 22 electrically disconnects the charge accumulation region 1a from the charge holding portion 3.

The first transfer electrode 21 includes a first layer 21a and second layer 21b. The first layer 21a extends along an upper surface SBa of the semiconductor substrate SB. The second layer 21b is arranged on the first layer 21a, and has a lower transmittance of light than the first layer 21a. The first layer 21a is formed of, for example, polysilicon. The second layer 21b is formed of, for example, a metal silicide material. The second layer 21b is formed of, for example, a material prepared by silicidating a refractory metal such as cobalt, tungsten, nickel, or titanium. When the first layer 21a is formed of polysilicon, and the second layer 21b is formed of a metal silicide, the second layer 21b has a lower transmittance of light than the first layer 21a.

On the other hand, as shown in FIG. 4A, a channel region 42 of the second transfer unit (transfer transistor) 4 is arranged between the charge holding portion 3 and charge-voltage converter 5 in the p-type well 30 in the semiconductor substrate SB. The channel region 42 is a semiconductor region containing a p-type impurity. When the second transfer control signal of active level is supplied to the second transfer electrode 41 via the second transfer control line 112 and contact plug 116 (see FIG. 3), a channel which electrically connects the charge holding portion 3 and charge-voltage converter 5 is formed in the channel region 42. When the second transfer control signal of inactive level is supplied to the second transfer electrode 41, the channel region 42 electrically disconnects the charge holding portion 3 from the charge-voltage converter 5.

The second transfer electrode 41 is formed of the same material as that of the first layer 21a in the first transfer electrode 21. The second transfer electrode 41 is formed of, for example, polysilicon. The second transfer electrode 41 undergoes potential control independently of the first transfer electrode 21.

A case will be examined below in which the second transfer electrode is arranged to completely cover the first transfer electrode. In this case, in order to supply the first transfer control signal, which is different from the second transfer control signal supplied to the second transfer electrode, to the first transfer electrode, an opening has to be formed in the second transfer electrode to partially expose the upper surface of the first transfer electrode. Then, a contact plug has to be formed to have a size smaller than that opening diameter, and to be connected to the first transfer electrode. As a result, a layer structure including the first and second transfer electrodes and the contact plugs required to supply control signals to these electrodes becomes complicated.

Also, in this case, the second transfer electrode extends up to a region above the light-receiving surface of the photoelectric conversion unit so as to completely cover the first transfer electrode. Then, an unintended potential barrier may be formed in the photoelectric conversion unit at a timing at which a charge is to be transferred from the photoelectric conversion unit to the charge holding portion, and the charge transfer efficiency from the photoelectric conversion unit to the charge holding portion may deteriorate.

By contrast, in this embodiment, the first transfer electrode 21 extends to cover the charge holding portion 3 to optically shield the charge holding portion 3, and not to overlap the second transfer electrode when viewed from the direction perpendicular to the upper surface of the semiconductor substrate SB. Thus, a layer structure including the first and second transfer electrodes, and contact plugs required to supply control signals to these electrodes can be simplified. Since the second transfer electrode does not extend up to a region above the light-receiving surface of the photoelectric conversion unit, the charge transfer efficiency from the photoelectric conversion unit to the charge holding portion is hard to deteriorate.

Furthermore, in this embodiment, the first transfer electrode 21 includes the first layer 21a and the second layer 21b which has a lower transmittance of light than the first layer 21a. That is, the first transfer electrode 21 itself has light-shielding performance. Then, light beams PB1 and PB2 which become incident in the vicinity of the charge holding portion 3 are easily reflected or absorbed by the surface of the second layer 21b, that is, an upper surface 21c of the first transfer electrode 21. In this way, since incidence of light to the charge holding portion 3 is suppressed, the charge holding portion 3 can be sufficiently optically shielded even when the second transfer electrode is arranged not to completely cover the first transfer electrode.

Note that the incoming light beam PB2 becomes incident on an element isolation region under the first transfer electrode but it does not directly enter the charge holding portion if the first transfer electrode 21 itself does not have any light-shielding performance. However, the light beam which becomes incident on the element isolation region becomes stray light components, and some components may leak into the charge holding portion. Also, a charge generated at the lower portion of the element isolation region may be mixed into the charge holding portion. In order to obtain performance equal to the light-shielding performance of a mechanical shutter by the global electronic shutter function, it is important to suppress such slight leak components and mixed components.

Also, the upper surface 21c of the first transfer electrode 21 and an upper surface 41c of the second transfer electrode 41 have nearly equal heights from the upper surface SBa of the semiconductor substrate SB. A height H1 of the upper surface 21c of the first transfer electrode 21 is nearly equal to a height H2 of the upper surface 41c of the second transfer electrode 41. The first and second transfer electrodes 21 and 41 have bottom surfaces having nearly equal heights. That is, the first and second transfer electrodes 21 and 41 are arranged at the same level. This is because a polysilicon layer is formed to simultaneously form the first and second transfer electrodes 21 and 41 in a single process. That is, this polysilicon layer is patterned to obtain patterns of the first and second transfer electrodes 21 and 41, and the pattern of the first transfer electrode 21 selectively undergoes metal silicidation. In this manner, the first and second transfer electrodes 21 and 41 can be simultaneously formed. That is, a structure in which the first and second transfer electrodes are arranged at the same level is suited to formation in a simple process. Note that the polysilicon layer may be patterned in either a single process or different processes.

Therefore, according to this embodiment, there can be provided a photoelectric conversion device which is advantageous to simplify a process for forming a structure required to optically shield the charge holding portion which temporarily holds a charge generated by the photoelectric conversion unit. Since the first and second transfer electrodes are arranged at the same level, a flat structure can be easily obtained without forming any thick insulation film on the upper portions of the first and second transfer electrodes.

A buried channel region may be formed between the charge accumulation region 1a and charge holding portion 3 shown in FIG. 4B in place of the channel region 22. This buried channel region is an n-type semiconductor region formed by implanting an n-type impurity into a region having a predetermined depth from the surface SBa of the semiconductor substrate SB. The buried channel is a channel having a potential that makes a charge which overflows from the charge accumulation region 1*a* flow into the charge holding portion 3 during the time period in which the charge accumulation region 1*a* accumulates the charge. In this case, since a charge that overflows from the charge accumulation region 1*a* can be used, a wider dynamic range can be assured. Since a time period in which a charge generated by the photoelectric conversion unit 1 is held in the charge holding portion 3 becomes longer, sufficiently high light-shielding performance is required. In order to obtain such sufficiently high light-shielding performance, the structure in which the first transfer electrode itself has light-shielding performance is advantageous.

Alternatively, the effects of the present invention can also be obtained when the first transfer electrode is formed as a so-called metal gate electrode so that the first transfer electrode itself has light-shielding performance.

Figure 5:
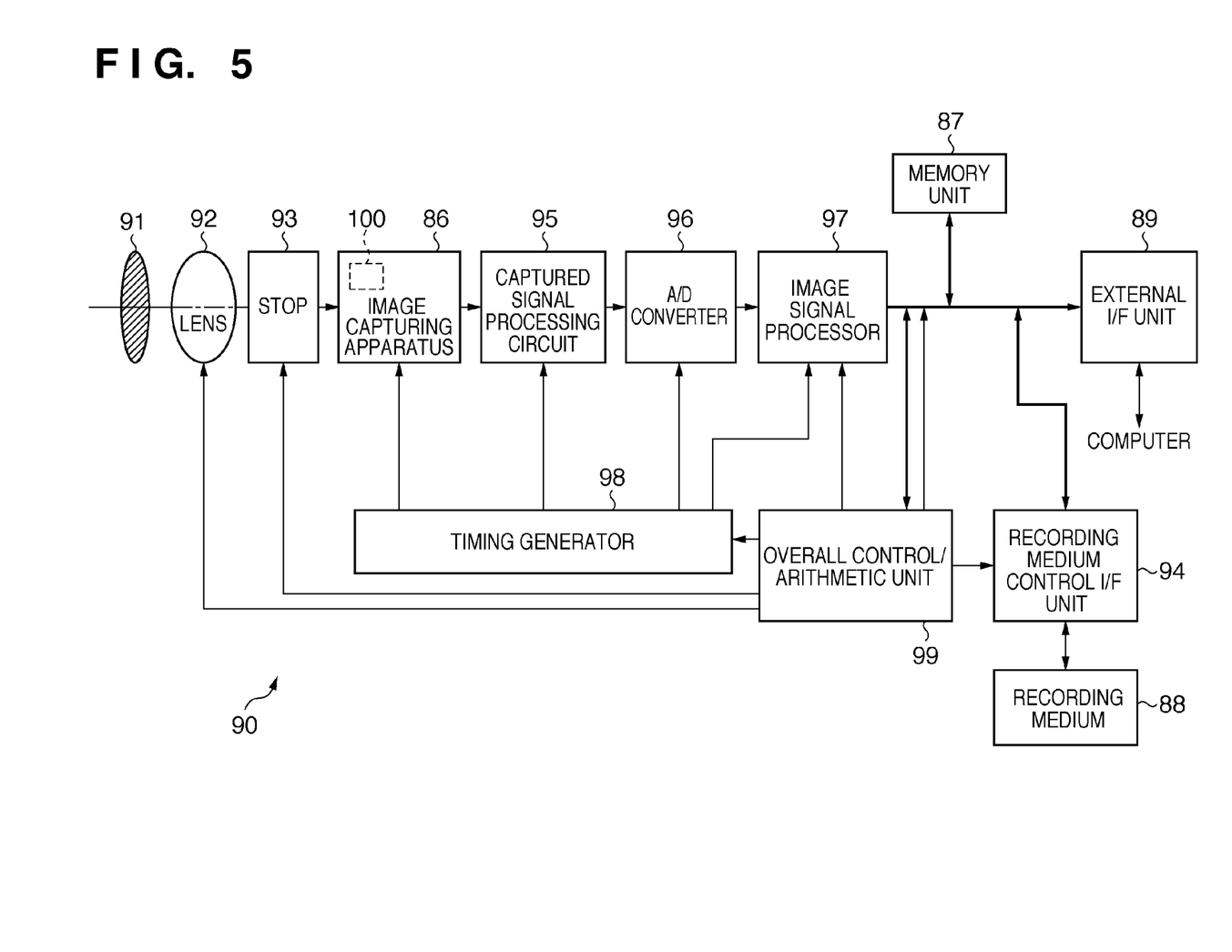
FIG. 5 is a block diagram showing the arrangement of an image capturing system to which the photoelectric conversion device according to the first embodiment is applied.

FIG. 5 shows an example of an image capturing system to which the photoelectric conversion device of the present invention is applied.

An image capturing system 90 mainly includes an optical system, an image capturing apparatus 86, and a signal processing unit, as shown in FIG. 5. The optical system mainly includes a shutter 91, imaging lens 92, and stop 93. The image capturing apparatus 86 includes the photoelectric conversion device 100. The signal processing unit mainly includes a captured signal processing circuit 95, A/D converter 96, image signal processor 97, memory unit 87, external I/F unit 89, timing generator 98, overall control/arithmetic unit 99, recording medium 88, and recording medium control I/F unit 94. Note that the signal processing unit may not include the recording medium 88.

The shutter 91 is arranged in front of the imaging lens 92 on an optical path, and controls exposure.

The imaging lens 92 refracts incoming light, and forms an object image on an imaging surface of the photoelectric conversion device 100 of the image capturing apparatus 86.

The stop 93 is arranged between the imaging lens 92 and photoelectric conversion device 100 on the optical path, and adjusts the amount of light guided to the photoelectric conversion device 100 after the light has passed through the imaging lens 92.

The photoelectric conversion device 100 of the image capturing apparatus 86 converts an object image formed on its imaging surface into an image signal. The image capturing apparatus 86 reads out the image signal from the photoelectric conversion device 100 and outputs the readout image signal.

The captured signal processing circuit 95 is connected to the image capturing apparatus 86, and processes the image signal output from the image capturing apparatus 86.

The A/D converter 96 is connected to the captured signal processing circuit 95, and converts the image signal (analog signal) after processing output from the captured signal processing circuit 95 into an image signal (digital signal).

The image signal processor 97 is connected to the A/D converter 96, and generates image data by applying arithmetic processing such as various corrections to the image signal (digital signal) output from the A/D converter 96. This image data is supplied to the memory unit 87, external I/F unit 89, overall control/arithmetic unit 99, recording medium I/F unit 94, and the like.

The memory unit 87 is connected to the image signal processor 97, and stores the image data output from the image signal processor 97.

The external I/F unit 89 is connected to the image signal processor 97. Then, the image data output from the image signal processor 97 is transferred to an external apparatus (e.g., a personal computer) via the external I/F unit 89.

The timing generator 98 is connected to the image capturing apparatus 86, captured signal processing circuit 95, A/D converter 96, and image signal processor 97. The timing generator 98 supplies timing signals to the image capturing apparatus 86, captured signal processing circuit 95, A/D converter 96, and image signal processor 97. Then, the image capturing apparatus 86, captured signal processing circuit 95, A/D converter 96, and image signal processor 97 operate in synchronism with the timing signals.

The overall control/arithmetic unit 99 is connected to the timing generator 98, image signal processor 97, and recording medium control I/F unit 94, and totally controls the timing generator 98, image signal processor 97, and recording medium control I/F unit 94.

The recording medium 88 is detachably connected to the recording medium control I/F unit 94. The image data output from the image signal processor 97 is recorded on the recording medium 88 via the recording medium control I/F unit 94.

With the above arrangement, when a satisfactory image signal is obtained by the photoelectric conversion device 100, a satisfactory image (image data) can be obtained.

Figure 6:
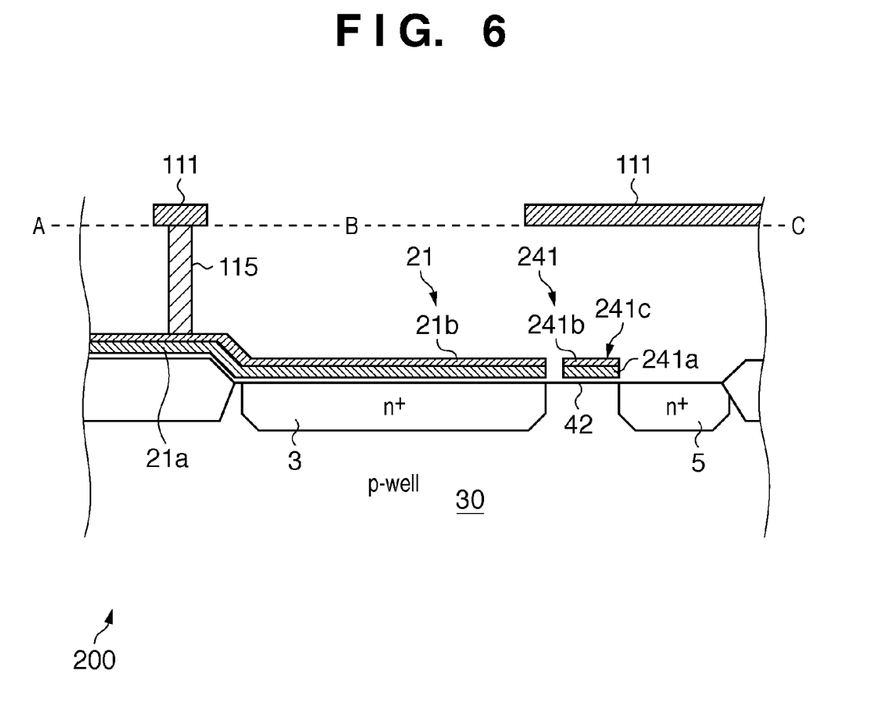
FIG. 6 is a sectional view showing the sectional structure of a photoelectric conversion device 200 according to the second embodiment of the present invention.

A photoelectric conversion device 200 according to the second embodiment of the present invention will be described below with reference to FIG. 6. FIG. 6 is a sectional view showing the sectional structure of the photoelectric conversion device 200 according to the second embodiment of the present invention. Differences from the first embodiment will be mainly explained below.

In the photoelectric conversion device 200, the structure of a second transfer electrode 241 is different from the first embodiment. The second transfer electrode 241 includes a third layer 241*a* and fourth layer 241*b*. The third layer 241*a* has the same height from an upper surface SBa of a semiconductor substrate SB as that of a first layer 21*a* in a first transfer electrode 21, and extends along the upper surface SBa of the semiconductor substrate SB. The fourth layer 241*b* has the same height from the upper surface SBa of the semiconductor substrate SB as that of a second layer 21*b* in the first transfer electrode 21, is arranged on the third layer 241*a*, and has a lower transmittance of light than the third layer 241*a*. The third layer 241*a* is formed of the same material as the first layer 21*a*, for example, polysilicon. The fourth layer 241*b* is formed of the same material as the second layer 21*b*, for example, a metal silicide material. The fourth layer 241*b* is formed of, for example, a material prepared by siliciding a refractory metal such as cobalt, tungsten, nickel, or titanium. When the third layer 241*a* is formed of polysilicon, and the fourth layer 241*b* is formed of a metal silicide, the fourth layer 241*b* has a lower transmittance of light than the third layer 241*a*.

According to the structure of this embodiment, since light that becomes incident on the second transfer electrode 241 is reflected or absorbed by its upper surface 241*c*, light leakage into a charge holding portion 3 can be further suppressed.

Also, a polysilicon layer used to form the first and second transfer electrodes 21 and 241 can be simultaneously formed in a single process. Then, after the polysilicon layer is patterned to obtain patterns of the first and second transfer electrodes 21 and 241, the pattern of the second transfer electrode 241 selectively undergoes metal silicidation in addition to that of the first transfer electrode 21, thereby simultaneously forming the first and second transfer electrodes 21 and 241. That is, the structure of this embodiment is suited to formation in a simple process. Therefore, this embodiment can also provide the photoelectric conversion device which is advantageous to simplify a process for forming a structure required to optically shield the charge holding portion which temporarily holds a charge generated by a photoelectric conversion unit.

Figure 7A:
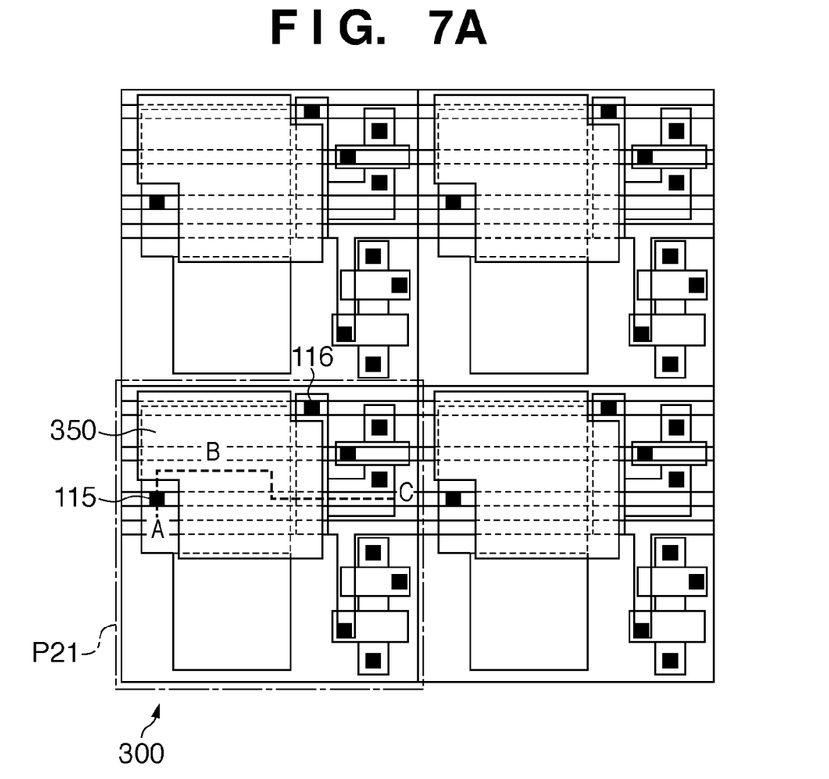
FIGS. 7A and 7B are views showing the structure of a photoelectric conversion device 300 according to the third embodiment of the present invention.
Figure 7B:
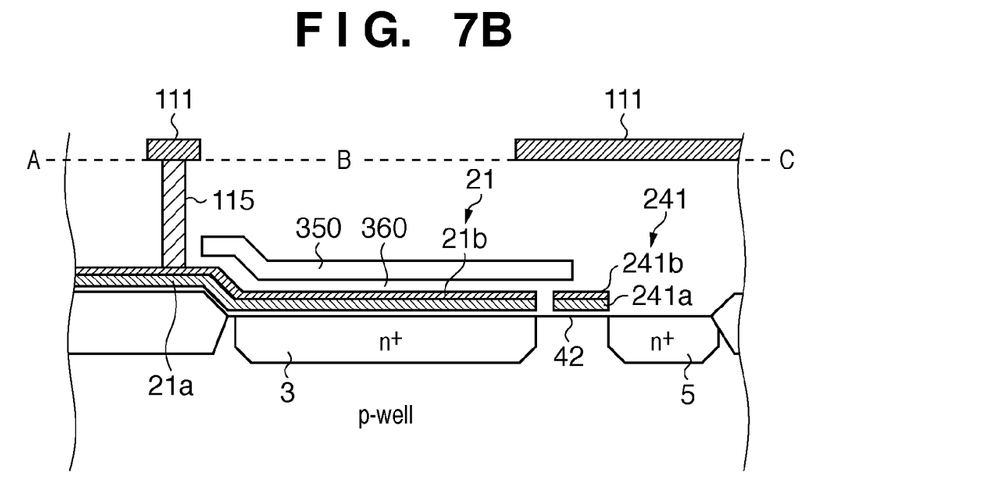

FIGS. 7A and 7B show a photoelectric conversion device 300 according to the third embodiment of the present invention. FIGS. 7A and 7B are views showing the structure of the photoelectric conversion device 300 according to the third embodiment of the present invention. FIG. 7A shows a layout arrangement example of the photoelectric conversion device 300, and FIG. 7B shows the sectional structure of the photoelectric conversion device 300. Differences from the first and second embodiments will be mainly explained below.

Depending on performance required to implement the global electronic shutter function, even when the upper portions of first and second transfer electrodes are formed of a metal silicide, a charge holding portion may not often be sufficiently optically shielded.

By contrast, in this embodiment, in the photoelectric conversion device 300, an insulation film 360 and light-shielding film 350 are further arranged. The insulation film 360 extends to cover first and second transfer electrodes 21 and 241. The light-shielding film 350 is arranged on the first transfer electrode 21 via the insulation film 360. The light-shielding film 350 extends up to a region above the second transfer electrode 241 via the insulation film 360. A material of the light-shielding film 350 includes those having high light-shielding performance such as tungsten, tungsten silicide, and aluminum.

Also, in this embodiment, a predetermined gap is assured so as to prevent a contact plug 115 and the light-shielding film 350 from being electrically connected (see FIG. 7A). Likewise, a gap is assured to prevent a contact plug 116 and the light-shielding film 350 from being electrically connected (see FIG. 7A). That is, the first and second transfer electrodes can independently undergo potential control.

When light becomes incident in the vicinity of the contact plugs 115 and 116, a light-shielding effect by the light-shielding film 350 cannot be expected. However, since the upper portions (metal silicide) of the first and second transfer electrodes have light-shielding performance, leakage of light into the charge holding portion can be prevented.

In FIGS. 7A and 7B, the potential of the light-shielding film 350 is not fixed, that is, in a floating state. However, the present invention is not limited to this, and the potential of the light-shielding film 350 may be configured to be controllable.

Figure 8A:
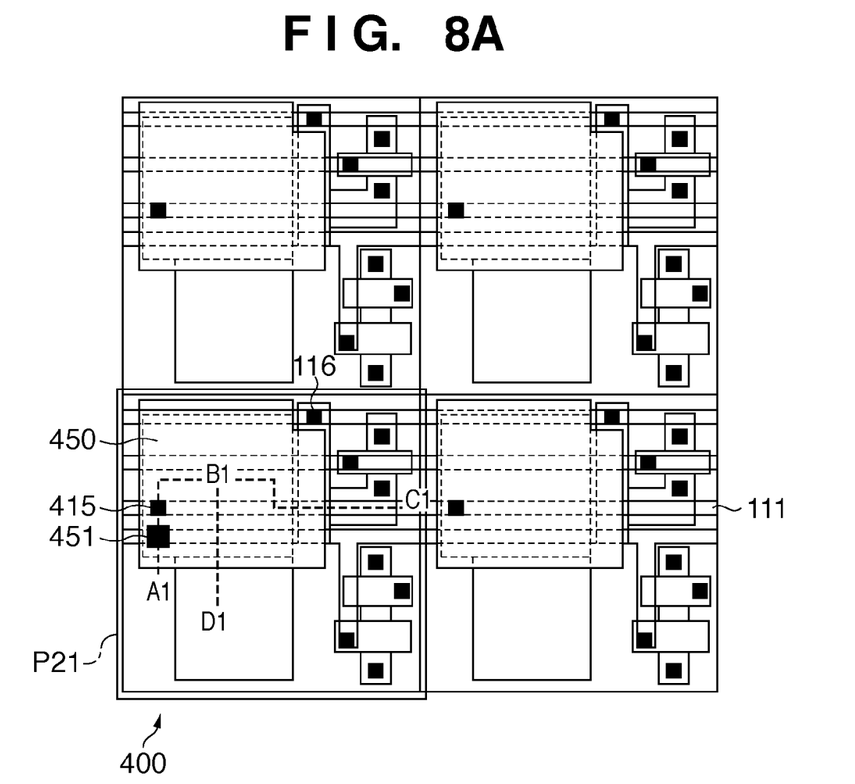
FIGS. 8A and 8B are views showing the structure of a photoelectric conversion device 400 according to the fourth embodiment of the present invention.
Figure 8B:
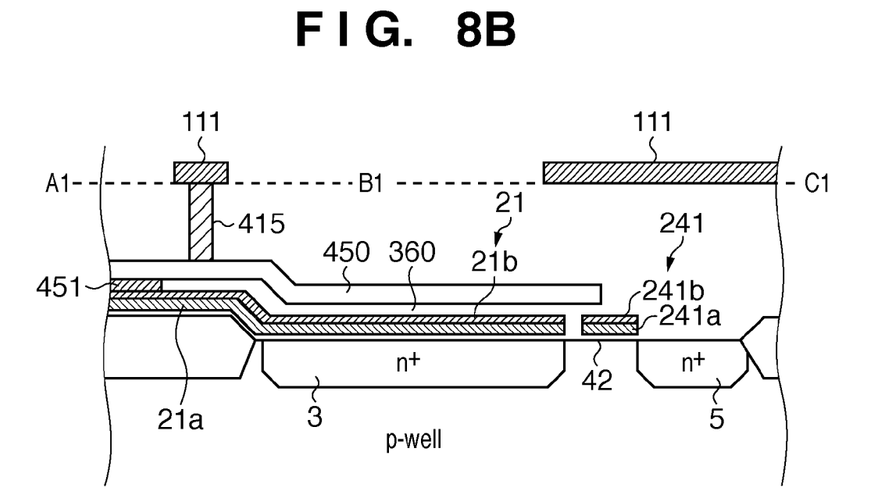

FIGS. 8A and 8B show a photoelectric conversion device 400 according to the fourth embodiment of the present invention. FIGS. 8A and 8B are views showing the structure of the photoelectric conversion device 400 according to the fourth embodiment of the present invention. FIG. 8A shows a layout arrangement example of the photoelectric conversion device 400, and FIG. 8B shows the sectional structure of the photoelectric conversion device 400. Differences from the first to third embodiments will be mainly explained below.

In the photoelectric conversion device 400, a light-shielding film 450 is connected to a first transfer control line 111 via a contact plug 415, and also to a first transfer electrode 21 via a contact plug 451. Then, the light-shielding film 450 can also shield light in the vicinity of the contact plug 451 connected to the first transfer electrode 21. That is, since the light-shielding film 450 can be laid out on a broader region on the first transfer electrode, leakage of light into the charge holding portion can be further suppressed. Also, the driving performance of the first transfer electrode 21 can be further improved.

Note that a contact plug 116 and the light-shielding film 450 are electrically isolated as in the third embodiment. In this way, the potentials of the first and second transfer electrodes can be independently controlled.

In this embodiment, the first transfer electrode and light-shielding film are connected, and the second transfer electrode and light-shielding film are isolated. However, the present invention is not limited to such specific structure. That is, the light-shielding film may be electrically connected to one of the first and second transfer electrodes, and may be electrically isolated from the other. When the second transfer electrode and light-shielding film are connected, and the first transfer electrode and light-shielding film are isolated, that light-shielding film can also shield light in the vicinity of the contact plug connected to the second transfer electrode. That is, since the light-shielding film can be laid out on a broader region on the second transfer electrode, leakage of light into the charge holding portion can be further suppressed. Whether the light-shielding film is to be connected to the first or second transfer electrode may be selected to further improve the light-shielding performance in consideration of a layout inside a pixel. Also, the driving performance of the transfer electrode connected to the light-shielding film can be improved.

A method of manufacturing the photoelectric conversion device 400 according to the fourth embodiment of the present invention will be described below with reference to FIGS. 9A to 9E. FIGS. 9A to 9E are process sectional views showing the method of manufacturing the photoelectric conversion device 400 according to the fourth embodiment of the present invention. In each of FIGS. 9A to 9E, a left-side view corresponds to a section taken along a D1-B1 line in FIG. 8A, and a right-side view corresponds to a section taken along a line A1-B1-C1 line in FIG. 8A. Note that a peripheral circuit portion region is not illustrated.

Figure 9A:
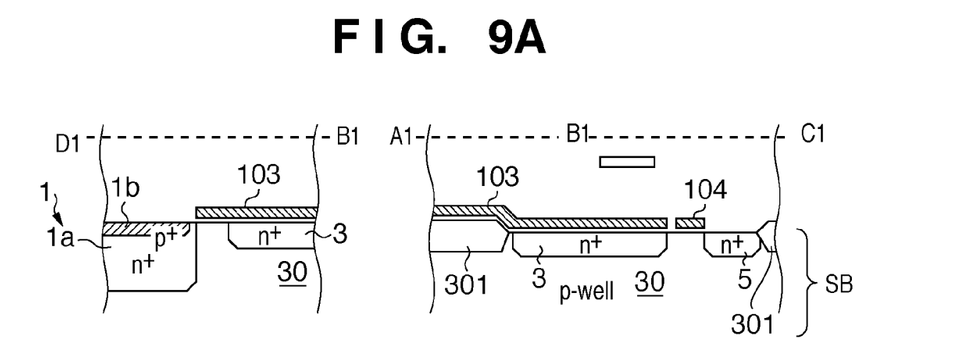
FIGS. 9A to 9E are process sectional views showing a method of manufacturing the photoelectric conversion device 400 according to the fourth embodiment of the present invention.

In a process shown in FIG. 9A, an n-type well (not shown) and a p-type well 30 are formed in a semiconductor substrate SB, and an STI or LOCOS element isolation portion 301 is then formed. The semiconductor substrate SB is formed of, for example, silicon.

Next, an n-type impurity is doped (by ion implantation) in the semiconductor substrate SB using a predetermined resist pattern as a mask, thereby forming a charge holding portion 3. Furthermore, various impurities may be implanted as needed to provide an electronic shutter function.

Subsequently, first and second polysilicon layers 103 and 104 are simultaneously formed on a prospective formation region of a first transfer electrode 21 and that of a second transfer electrode 241 on the semiconductor substrate SB. In this process (first process), the first polysilicon layer 103 is formed to cover the charge holding portion 3 and not to overlap the second polysilicon layer 104 when viewed from the direction perpendicular to an upper surface SBa of the semiconductor substrate SB.

After that, an n-type impurity is doped to form a charge accumulation region 1a of a photoelectric conversion unit 1. Next, a p-type impurity is doped to form a protection layer 1b required to form a buried structure of the photoelectric conversion unit (photodiode) 1. The charge accumulation region 1a is formed in the semiconductor substrate SB deeper than the charge holding portion 3.

An n-type impurity is then doped by ion implantation using a gate electrode as a mask, so as to form a semiconductor region, for example, a charge-voltage converter 5, that configures a part of a lightly doped source or drain self-aligned to the side surface of the gate electrode. Furthermore, a process for implanting various impurities may be executed in this case to provide an electronic shutter function.

Figure 9B:
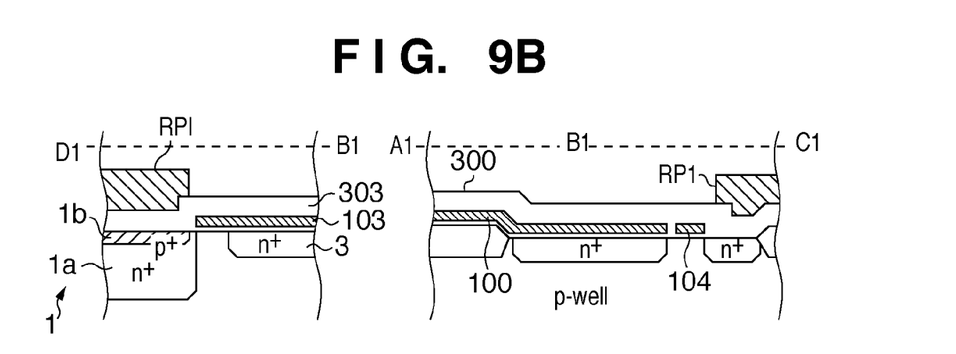

In a process (second process) shown in FIG. 9B, an insulation film 303 is formed to cover the first and second polysilicon layers 103 and 104. The insulation film 303 is formed to have a stacked structure of, for example, a silicon nitride film and silicon oxide film. In this case, the silicon nitride film can be used as an anti-reflection film for a light-receiving surface of the photoelectric conversion unit 1 or a liner film of a self-align contact. However, the present invention is not limited to this. The insulation film 303 is formed to at least cover the photoelectric conversion unit 1 in addition to the first and second polysilicon layers 103 and 104. With this structure, the photoelectric conversion unit 1 is protected from any etching damage in an etching process later.

The insulation film 303 is patterned to form a silicide protection. A resist pattern RP1 which selectively covers a non-silicide region including the photoelectric conversion unit 1 is formed.

Subsequently (in a third process), the insulation film 303 is etched using the resist pattern RP1 as a mask to expose the upper surfaces of the first and second polysilicon layers 103 and 104. At this time, the surfaces of the source and drain of a transistor in a pixel may be exposed. Note that the boundary of the resist pattern RP1 can be set to be closer to the center side of the photoelectric conversion unit 1 than the boundary between the photoelectric conversion unit 1 and first transfer electrode 21. Since the insulation film 303 is also formed on the side wall of the first polysilicon layer 103, even when the boundary of the resist pattern RP1 is set on the center side of the photoelectric conversion unit 1, the photoelectric conversion unit 1 is prevented from being silicidated in a silicidation process to be described later, and the surface of the photoelectric conversion unit 1 is unlikely to be exposed by dry etching in the next process. When an interval between the first and second polysilicon layers 103 and 104 is as small as, for example, about 0.2 µm, a gap portion which forms a gap between these layers is hardly silicidated even when no resist pattern is formed. Hence, in this case, a resist pattern may not be formed on the gap portion between the first and second polysilicon layers 103 and 104.

In the sequence of this manufacturing method, the resist pattern RP1 also covers, for example, a non-silicide region such as an active region of a transistor in a pixel. Using this resist pattern RP1, the structure of a transistor in a peripheral circuit portion and that in a pixel may be changed. For example, a transistor with an LDD structure having a source and drain formed of lightly and heavily doped regions may be formed in the peripheral circuit portion, and a transistor formed of only lightly doped regions may be formed in a pixel. This structure can be obtained by forming a heavily doped region of the peripheral circuit portion using the resist pattern RP1 as a mask. In this way, a merit of shortening the process can be expected.

When a transistor in a pixel is configured to also have an LDD structure, after protection of the photoelectric conversion unit 1 and formation of the LDD structure of a transistor are made again using another mask, the resist pattern RP1 may be formed to form a silicide protection. Note that silicidation of the surfaces of the first and second transfer electrodes in a pixel aims at enhancing the light-shielding performance, and that of the peripheral circuit portion may also be made in the same process. Note that the silicide protection may also serve as an anti-reflection film or liner film, as described above.

Subsequently (in a fourth process), a metal layer (not shown) is formed to cover the first polysilicon layer 103, second polysilicon layer 104, and etched insulation film 303. The metal layer is formed of a refractory metal such as cobalt, tungsten, nickel, or titanium. After that (a fifth process, silicidation process), annealing is performed to silicidate the upper portions of the first and second polysilicon layers 103 and 104, respectively. That is, the upper portions of the first and second polysilicon layers 103 and 104 are converted to a second layer (first metal silicide layer) 21b and fourth layer (second metal silicide layer) 241b. Then, the first transfer electrode 21 including the first layer (the lower portion of the first polysilicon layer 103) 21a and the second layer (first metal silicide layer) 21b is formed. At the same time, the second transfer electrode 241 including a third layer (the lower portion of the second polysilicon layer) 241a and the fourth layer (second metal silicide layer) 241b is formed. That is, the first and second transfer electrodes 21 and 241 are formed simultaneously.

Figure 9C:
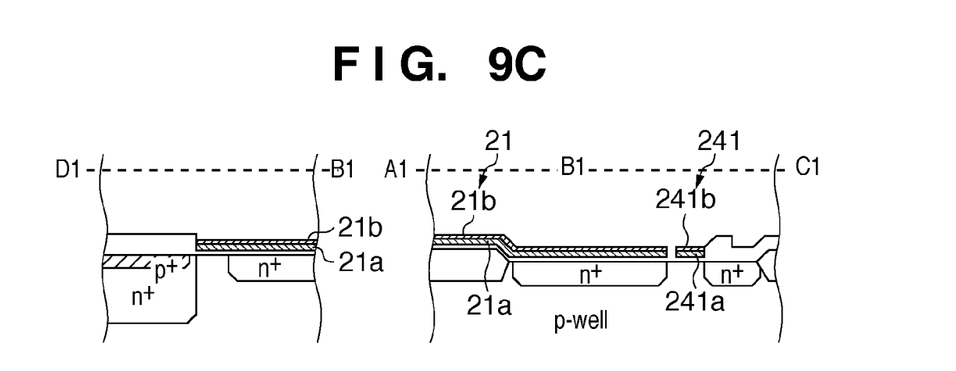

In the process shown in FIG. 9C, an unreacted refractory metal in the metal layer is removed by etching off. Although the peripheral circuit portion region is not illustrated, polysilicon and an active region of the peripheral circuit portion may be simultaneously silicidated as needed.

Figure 9D:
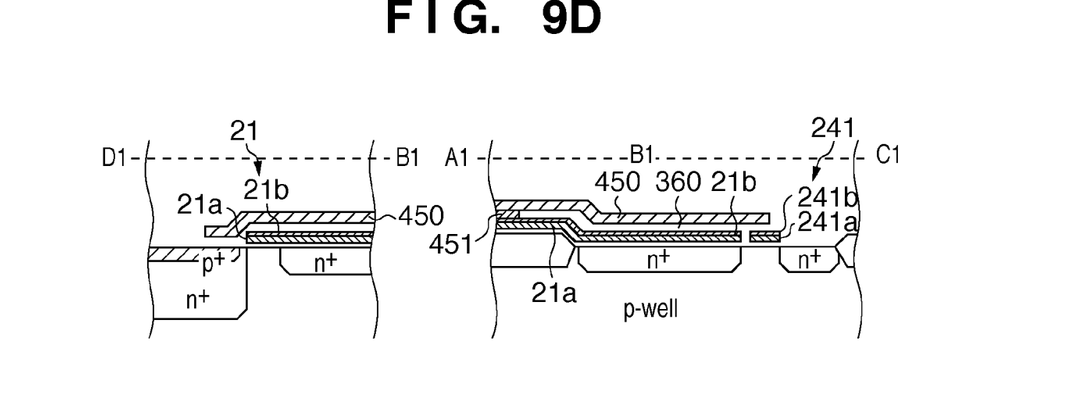

In the process shown in FIG. 9D, an insulation film 360 is formed to cover the first and second transfer electrodes 21 and 241. After that, a contact hole is formed in the insulation film 360, and a metal such as tungsten is buried in that contact hole, thus forming a contact plug 451. Then, a light-shielding film 450 is formed to cover the upper surface of the contact plug 451 and to extend from a region above the first transfer electrode 21 to that above the second transfer electrode 241 via the insulation film 360. The light-shielding film 450 is formed of, for example, a material having high light-shielding performance such as tungsten, tungsten silicide, or aluminum.

Note that the contact plug 451 and light-shielding film 450 may be simultaneously formed using the same material. Then, the formation process of the contact plug 451 and light-shielding film 450 can be simplified. The light-shielding film 450 may be formed by burying a material in grooves patterned on the insulation film in place of patterning of the metal layer.

Figure 9E:
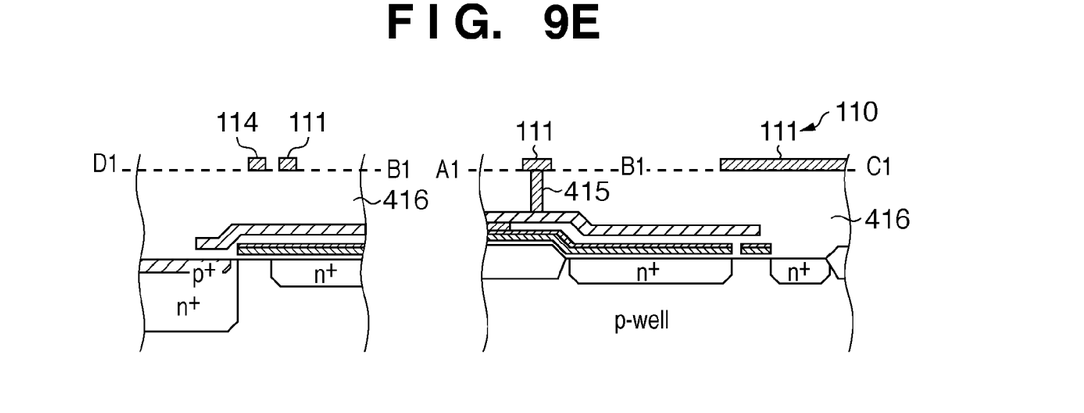

In the process shown in FIG. 9E, an interlayer insulation film 416 is formed to cover the light-shielding film 450. The interlayer insulation film 416 uses, for example, a BPSG film. Then, a contact hole is formed at a predetermined position, and a metal such as tungsten is buried in that contact hole, thereby forming a contact plug 415. After that, a wiring pattern 110 including first and second transfer control lines 111 and 112 is formed.

Furthermore, although not shown, other interlayer insulation films, other interconnection layers, an intra-layer lens, color filters, microlens, and the like are formed, but a description thereof will not be given.

When a semi-global electronic shutter function is implemented using a photoelectric conversion device, lines have to be connected to the source, drain, and gate of each transistor in a pixel via contact plugs. Also, the gate of each transistor in a pixel has to independently undergo potential control. In such photoelectric conversion device, when the light-shielding film 450 is arranged, gaps have to be formed between the respective contact plugs and light-shielding film 450 so as to electrically isolate them. It is ideal to completely cover regions other than the photoelectric conversion unit using a light-shielding film, but it is hard to implement due to the aforementioned problem. Hence, in this embodiment, a silicide layer is formed on at least portions of the first transfer electrode, second transfer electrode, and an active region on which no light-shielding film is arranged. However, a floating diffusion serving as the charge-voltage converter may be configured not to form a silicide layer on its upper portion in consideration of holding a charge.

Alternatively, a silicide layer may be formed on the upper portion of the charge-voltage converter. More specifically, the charge-voltage converter 5 is formed to include first and second regions. The second region is arranged on the first region to form a part of the upper surface of the semiconductor substrate SB, and is formed of a metal silicide material. Thus, leakage of light that becomes incident on the charge-voltage converter 5 into the charge holding portion can be reduced.

A gate 61 of a reset unit (reset transistor) 6, a gate 71 of an output unit (amplification transistor) 7, a gate 81 of a selection unit (selection transistor) 8, and active regions of respective transistors are partially silicidated. Then, leakage of light that becomes incident on the silicide regions into the charge holding portion can be further reduced.

The structures of the aforementioned embodiments can be combined as needed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-005135, filed Jan. 13, 2009, which is hereby incorporated by reference herein in its entirety.

What is claimed is:

1. A photoelectric conversion device comprising:
    a photoelectric conversion unit arranged in a semiconductor substrate;
    a charge holding portion arranged in the semiconductor substrate;
    a first transfer electrode arranged at a position above the charge holding portion;
    a charge-voltage converter arranged in the semiconductor substrate;
    a second transfer electrode arranged at a position above the semiconductor substrate and between the charge holding portion and the charge-voltage converter;
    an insulation film arranged to cover the first and second transfer electrodes;
    a first transfer control line for controlling the first transfer electrode, the first transfer control line being arranged above the insulation film;
    a second transfer control line for controlling the second transfer electrode, the second transfer control line being arranged above the insulation film; and
    a light-shielding film arranged between the insulation film and a plane on which at least one of the first and second transfer control lines is arranged,
    wherein the light-shielding film extends from a position above the first transfer electrode to a position above the second transfer electrode, and
    wherein (a) the light-shielding film is electrically connected to the first transfer electrode and the first control line, and electrically disconnected from the second transfer electrode and the second control line, or (b) the light-shielding film is electrically connected to the second transfer electrode and the second control line, and electrically disconnected from the first transfer electrode and the first control line.

2. The device according to claim 1, wherein the first transfer electrode includes:
    a first layer which extends along an upper surface of the semiconductor substrate; and
    a second layer which is arranged above the first layer to optically shield the first layer.

3. The device according to claim 1, wherein the first transfer electrode is formed of a metal.

4. The device according to claim 2, wherein the second layer is formed of a metal silicide material.

5. The device according to claim 1, wherein the first transfer electrode and the second transfer electrode are arranged to have the same height from an upper surface of the semiconductor substrate.

6. An image capturing system comprising:
    a photoelectric conversion device according to claim 1;
    an optical system which forms an image on an imaging surface of the photoelectric conversion device; and
    a signal processing unit which generates image data by processing a signal output from the photoelectric conversion device.

7. The device according to claim 1, further comprising:
    a contact plug arranged between the first transfer control line and the light-shielding film or between the second transfer control line and the light-shielding film.

8. The device according to claim 1, further comprising:
    a contact plug arranged between the first transfer electrode and the light-shielding film or between the second transfer electrode and the light-shielding film.

9. The device according to claim 1, further comprising:
    an amplification transistor which has a gate electrically connected to the charge-voltage converter.

10. The device according to claim 1, further comprising:
    an element isolation portion, wherein the light-shielding film extends to a position above the element isolation portion.

11. The device according to claim 1, wherein the insulation layer has a groove and the light-shielding film is formed in the groove.

12. The device according to claim 2, wherein the second transfer electrode includes:
    a third layer which has the same height from an upper surface of the semiconductor substrate as the first layer, and extends along the upper surface of the semiconductor substrate; and
    a fourth layer which has the same height from the upper surface of the semiconductor substrate as the second layer, and is arranged on the third layer to optically shield the third layer.

13. The device according to claim 12, wherein the fourth layer is formed of a metal silicide material.

14. The device according to claim 4, wherein the charge-voltage converter includes:
    a first region; and
    a second region which is arranged on the first region to form a portion of the upper surface of the semiconductor substrate, and is formed of a metal silicide material.

15. The device according to claim 8, wherein the contact plug is integrally formed with the light-shielding film or between the second transfer electrode and the light-shielding film.

* * * * *